United States Patent
Chan et al.

(10) Patent No.: US 9,306,042 B2
(45) Date of Patent: Apr. 5, 2016

(54) BIPOLAR TRANSISTOR WITH CARBON ALLOYED CONTACTS

(71) Applicant: INTERNATIONAL BUSINESS MACHINES CORPORATION, Armonk, NY (US)

(72) Inventors: Kevin K. Chan, Saten Island, NY (US); Bahman Hekmatshoartabari, White Plains, NY (US); Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/182,930

(22) Filed: Feb. 18, 2014

(65) Prior Publication Data

US 2015/0236093 A1  Aug. 20, 2015

(51) Int. Cl.
*H01L 29/732* (2006.01)
*H01L 29/66* (2006.01)
*H01L 29/08* (2006.01)
*H01L 29/167* (2006.01)
*H01L 29/10* (2006.01)

(52) U.S. Cl.
CPC .......... *H01L 29/732* (2013.01); *H01L 29/0804* (2013.01); *H01L 29/0808* (2013.01); *H01L 29/0821* (2013.01); *H01L 29/0826* (2013.01); *H01L 29/1004* (2013.01); *H01L 29/167* (2013.01); *H01L 29/66234* (2013.01); *H01L 29/66272* (2013.01); *H01L 29/66287* (2013.01)

(58) Field of Classification Search
CPC ............ H01L 29/0804; H01L 29/0808; H01L 29/0821; H01L 29/0826; H01L 29/66234; H01L 29/66287; H01L 29/732; H01L 29/1004
See application file for complete search history.

(56) References Cited

U.S. PATENT DOCUMENTS

| | | | |
|---|---|---|---|
| 5,001,534 A | 3/1991 | Lunardi et al. | |
| 5,321,302 A | 6/1994 | Shimawaki | |
| 5,395,774 A | 3/1995 | Bajor et al. | |
| 5,465,001 A * | 11/1995 | Skotnicki et al. | 257/370 |
| 6,800,881 B2 | 10/2004 | Lippert et al. | |
| 7,019,341 B2 | 3/2006 | Lippert et al. | |
| 2009/0179228 A1 * | 7/2009 | Joseph et al. | 257/197 |

* cited by examiner

*Primary Examiner* — Thanhha Pham
(74) *Attorney, Agent, or Firm* — Tutunjian & Bitetto, P.C.; Louis J. Percello

(57) ABSTRACT

A method for forming a bipolar junction transistor includes forming a collector intrinsic region, an emitter intrinsic region and an intrinsic base region between the collector intrinsic region and the emitter intrinsic region. A collector extrinsic contact region is formed in direct contact with the collector intrinsic region; an emitter extrinsic contact region is formed on the emitter intrinsic region and a base extrinsic contact region is formed in direct contact with the intrinsic base region. Carbon is introduced into at least one of the collector extrinsic contact region, the emitter extrinsic contact region and the base extrinsic contact region to suppress diffusion of dopants into the junction region.

14 Claims, 5 Drawing Sheets

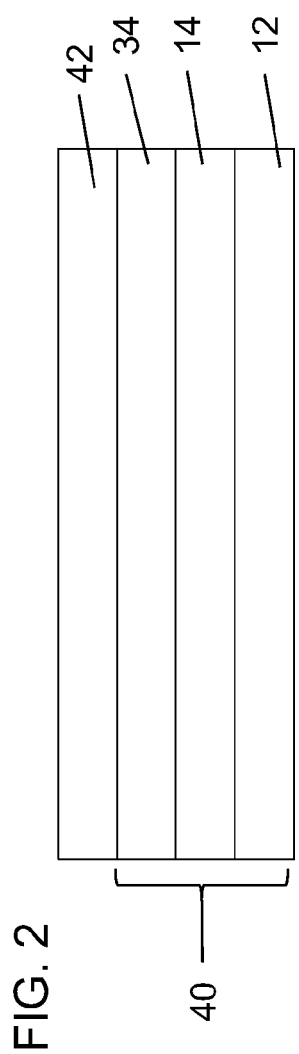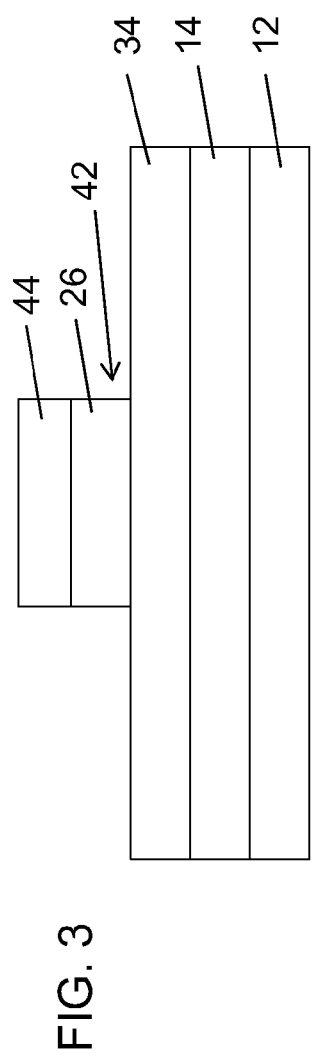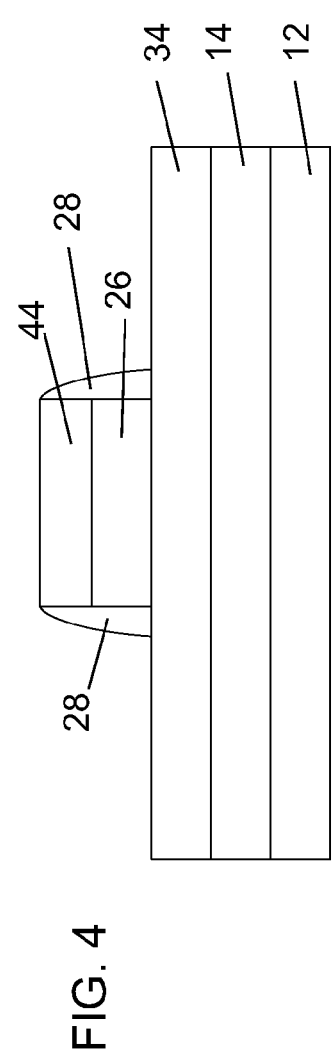

BIPOLAR TRANSISTOR WITH CARBON ALLOYED CONTACTS

BACKGROUND

1. Technical Field

The present invention relates to transistor devices and methods for formation, and more particularly to bipolar transistors with carbon alloyed contacts.

2. Description of the Related Art

Diffusion of impurities is in nano-scale devices is a challenge. In nano-scale devices including transistors, such as lateral bipolar junction transistors (BJTs), diffusion of impurities must be suppressed to avoid junction widening. For example, in a lateral n-p-n BJT, phosphorous or other n-type impurities may diffuse from an $n^+$ doped emitter and/or collector regions into to a p-type base and compromise the doping of the base region (reduce or counter-dope). Similarly, in a p-n-p device, phosphorous or other n-type impurity may diffuse from $n^+$ doped extrinsic base into the n-type intrinsic base. The same applies to the diffusion of p-type impurities, such as, boron.

SUMMARY

A method for forming a bipolar junction transistor includes forming a collector intrinsic region, an emitter intrinsic region and an intrinsic base region between the collector intrinsic region and the emitter intrinsic region. A collector extrinsic contact region is formed in contact with the collector intrinsic region; an emitter extrinsic contact region is formed in contact with the emitter intrinsic region and a base extrinsic contact region is formed in contact with the intrinsic base region. Carbon is introduced into at least one of the collector extrinsic region, the emitter extrinsic region and the base extrinsic region to suppress diffusion of dopants into the intrinsic base region.

Another method for forming a bipolar junction transistor includes growing an epitaxial layer on a semiconductor layer; forming a mask on the epitaxial layer and etching the epitaxial layer to form an extrinsic base region therein and to define an intrinsic base region in the semiconductor layer; forming spacers on lateral sides of the extrinsic base region; doping the semiconductor layer on opposite sides of the extrinsic base region to form an intrinsic collector region and an intrinsic emitter region; growing an extrinsic collector region and an extrinsic emitter region from the intrinsic collector region and the intrinsic emitter region, respectively; introducing carbon into at least one of the extrinsic collector region, the extrinsic emitter region and the extrinsic base region to suppress diffusion of dopants into the intrinsic base region; and forming conductive contacts on the extrinsic base region, the extrinsic collector region and the extrinsic emitter region.

A bipolar transistor device includes a collector intrinsic region, an emitter intrinsic region and an intrinsic base region formed between the collector intrinsic region and the emitter intrinsic region. A collector extrinsic contact region is formed in contact with the collector intrinsic region, and an emitter extrinsic contact region is formed in contact with the emitter intrinsic region. A base extrinsic contact region is formed in contact with the intrinsic base region. Carbon is introduced into at least one of the collector extrinsic contact region, the emitter extrinsic contact region and the base extrinsic contact region to suppress diffusion of dopants into the intrinsic base region.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 2 is a cross-sectional view of a substrate (e.g., GOI) having an epitaxial layer grown on a semiconductor layer in accordance with the present principles;

FIG. 3 is a cross-sectional view of the substrate of FIG. 2 having the epitaxial layer patterned on the semiconductor layer using a mask to form an extrinsic base region and to define an intrinsic base region therebelow in accordance with the present principles;

FIG. 4 is a cross-sectional view of the substrate of FIG. 3 having spacers formed on sidewalls of the patterned epitaxial layer in accordance with the present principles;

DETAILED DESCRIPTION OF PREFERRED EMBODIMENTS

Figure 1:
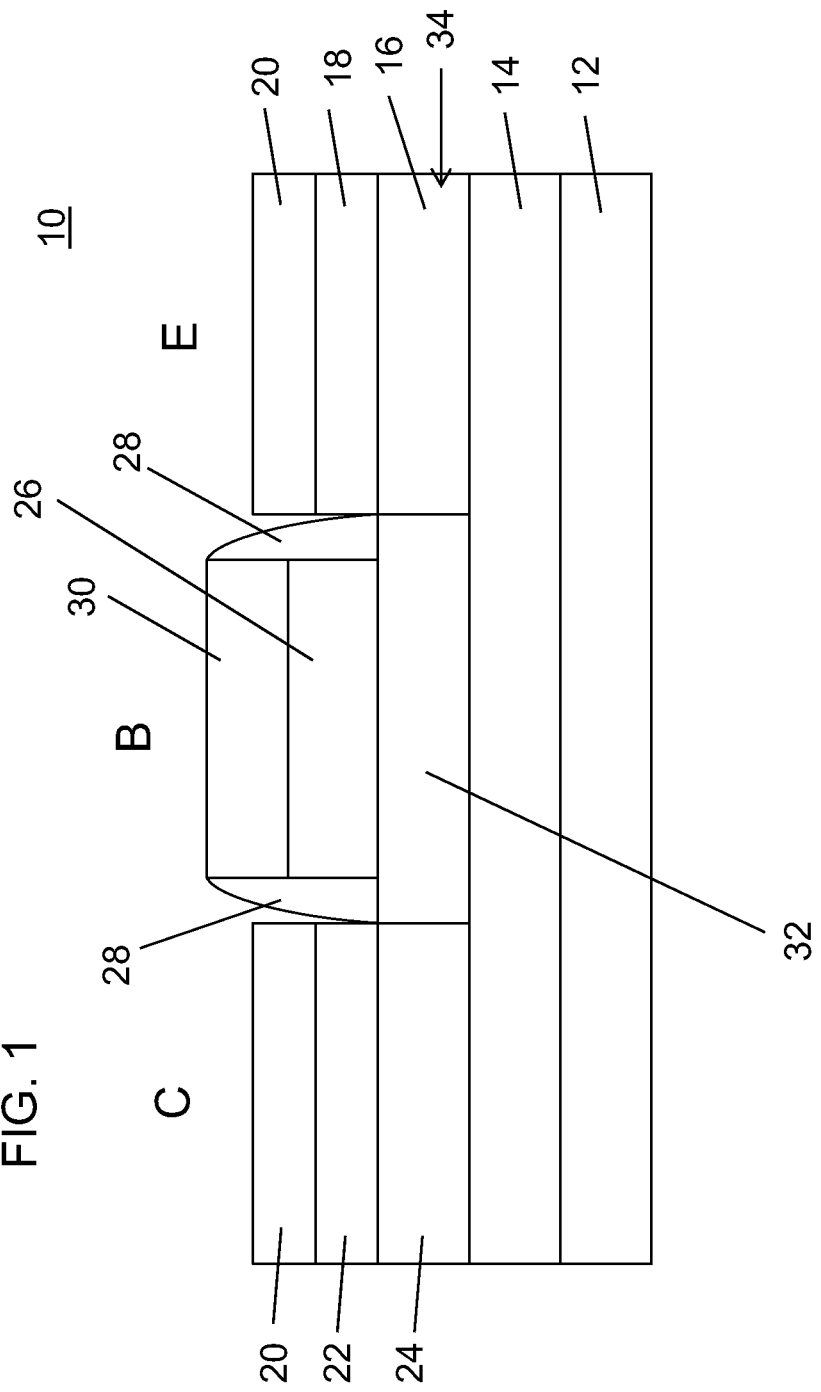
FIG. 1 is a cross-sectional view of a lateral bipolar junction transistor having carbon introduced for diffusion suppression in accordance with the present principles.

In accordance with the present principles, bipolar transistor devices are provided wherein at least one of an extrinsic base, collector or emitter region includes carbon (preferably less than about 5 atomic percent) to suppress the diffusion of impurities. In some embodiments, intrinsic emitter and/or collector regions may also include carbon (preferably less than about 1 atomic percent). Methods for fabricating the bipolar transistor devices in accordance with the present principles are also described.

It is to be understood that the present invention will be described in terms of a given illustrative architecture on a wafer or substrate; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design in accordance with the present embodiments may be implemented in an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is greater than or equal to 0 and less than or equal to 1, etc. In addition, other elements may be included in the compound, such as, e.g., dopants or impurities, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a bipolar junction transistor (BJT) 10 is shown in accordance with one illustrative embodiment. In one example, the BJT 10 is formed on a semiconductor-on-insulator (SOI) structure. In a particularly useful embodiment, the semiconductor includes Ge to form a Ge-on-insulator (GOI) structure. It should be understood that bulk substrate materials or other substrates may be employed. The BJT 10 in the present example includes a base substrate 12, which may include any suitable semiconductor material. For example, the substrate 12 may include Si, SiGe, SiC, II-V, materials, II-VI materials, ceramics, etc.

A dielectric layer 14 is provided or formed over the substrate 12. The dielectric layer 14 may include a buried layer, such as a buried oxide, although any suitable dielectric material may be employed.

The BJT 10 includes a collector C, emitter E and a base B. The collector C and the emitter E include extrinsic regions 22 and 18, respectively, and intrinsic regions 24 and 16, respectively. The extrinsic regions 22 and 18 include a metal or conductive contact 20 formed thereon. The base B includes an extrinsic base 26, which also includes a metal or conductive contact 30 formed thereon. The extrinsic base 26 and its respective contact 30 are electrically isolated from the collector C and emitter E using spacers 28. The spacers may include a nitride or other suitable dielectric material.

Below the extrinsic contact 26 of the base B is an intrinsic base region 32, which is enabled to permit charge flow between the collector C and emitter E. In one embodiment, the intrinsic regions 24 and 16 and the intrinsic base region 32 are formed from a semiconductor portion 34 of the SOI structure. Each region is doped to provide an n-p-n structure (for example, intrinsic region 24 is n-type doped, intrinsic region 16 is n-type doped, and the intrinsic base region 32 is p-type doped) or p-n-p structure (for example, intrinsic region 24 is p-type doped, intrinsic region 16 is p-type doped, and the intrinsic base region 32 is n-type doped).

Active emitter and active collector regions are the intrinsic regions 24, 16 of the emitter and collector. These intrinsic regions 24, 16 are contacted, by the extrinsic emitter region 22 (emitter contact) or the extrinsic collector region 18 (the collector contact). The extrinsic base region 26 is formed in direct contact to the intrinsic base region 32.

In useful embodiments, the semiconductor portion 34 includes Ge, and preferably monocrystalline Ge. The semiconductor portion 34 includes the intrinsic regions 24 and 16, which may be n+ doped, and the intrinsic base region 32, which is p-type doped. The extrinsic contacts 22, 26 and 18 may include SiGe formed on the Ge intrinsic regions. The SiGe for the extrinsic contacts 22, 26 and 18 may be epitaxially grown from the Ge of the intrinsic regions 24 and 16 and the intrinsic base region 32. The extrinsic contacts 22 and 18 may include n+ doped SiGe and the extrinsic contact 26 may include p+ doped SiGe.

In other useful embodiments, the semiconductor portion 34 includes Ge, and preferably monocrystalline Ge. The semiconductor portion 34 includes the intrinsic regions 24 and 16, which may be p+ doped, and the intrinsic base region 32, which is n-type doped. The extrinsic contacts 22, 26 and 18 may include SiGe formed on the Ge intrinsic regions. The SiGe for the extrinsic contacts 22, 26 and 18 may be epitaxially grown from the Ge of the intrinsic regions 24 and 16 and the intrinsic base region 32. The SiGe is preferably single crystalline or polycrystalline. The extrinsic contacts 22 and 18 may include p+ doped SiGe and the extrinsic contact 26 may include n+ doped SiGe.

The intrinsic regions 24 and 16 may be n+ doped, and the intrinsic base region 32 may be p-type doped. The extrinsic contacts 22, 26 and 18 may include SiGe formed on the Ge intrinsic regions. The SiGe for the extrinsic contacts 22, 26 and 18 may be epitaxially grown from the Ge of the intrinsic regions 24 and 16 and the intrinsic base region 32. The SiGe is preferably single crystalline or polycrystalline. The extrinsic contacts 22 and 18 may include p+ doped SiGe, and the extrinsic contact 26 may include n+ doped SiGe.

In nano-device structures, dopants from the intrinsic emitter and intrinsic collector regions 24, 16 can diffuse into the intrinsic base region 32. In some cases, dopants from the extrinsic contact regions 22, 26, 18 can diffuse into the intrinsic base region 32 as well. For example, the dopants from the extrinsic emitter contact 22 can first diffuse into the intrinsic emitter region 24 and then into the intrinsic base region 32. Any unintended diffusion of dopants into the intrinsic base region 32 negatively impacts the properties of the bipolar junction transistor or otherwise degrades its performance. For example, if dopants from the extrinsic base region 26 diffuse into the intrinsic base region 32, the intrinsic base region becomes more heavily doped than the design target and the transistor current will decrease. If dopants from the emitter region 24 and the collector region 16 diffuse into the intrinsic base region 32, the physical separation between regions 24 and 16 becomes smaller and the transistor characteristics could be negatively affected, for example the transistor breakdown voltage could be reduced.

In accordance with the present principles, at least one of the extrinsic contacts 22, 26 and 18 may include carbon to reduce diffusion of the dopants. The carbon content in at least one of the extrinsic regions 22, 26 and 18 may be less than about 5% at. with less than about 1% at. being preferred. In one embodiment, all of the extrinsic regions 22, 26 and 18 include carbon. In other embodiments, one or two of the extrinsic regions 22, 26 and 18 include carbon.

In accordance with the present principles, at least one of the intrinsic regions 16 and 24 may include carbon to reduce diffusion of the dopants. The carbon content in at least one of the intrinsic regions 16 and 24 may be less than about 1% at. with less than about 0.5% at. being preferred. In one embodiment, one of the intrinsic regions 16 or 24 includes carbon. In other embodiments, two of the intrinsic contacts 16 and 24 include carbon. In still other embodiments, combinations of the intrinsic regions 16, 24 and extrinsic regions 22, 26 and 18 may include carbon.

The semiconductor portion 34 and the extrinsic regions 22, 26 and 18 may include other materials. For these other materials, the semiconductor portion 34 should include an energy bandgap smaller than the semiconductor material used to form the extrinsic contacts 22, 26, and 18. In one combination, Ge in layer 34 may be replaced by $Si_{1-x}Ge_x$ and SiGe in the extrinsic contacts 22, 26, and 18 may be replaced by $Si_{1-y}Ge_y$ with x>y. That is semiconductor portion 34 includes $Si_{1-x}Ge_x$ and the extrinsic contacts 22, 26 and 18 may include $Si_{1-y}Ge_y$ with x>y. In another combination, Ge may be replaced by SiGe and SiGe replaced by Si. For example, semiconductor portion 34 includes SiGe and the extrinsic contacts 22, 26 and 18 may include Si. For suppression of dopant diffusion, C has been found to be effective for use in Si, SiGe and Ge materials.

Nanodevices, or devices having physical dimensions measured in nanometers, benefit most from the present embodiments. As an example, a bipolar junction transistor as depicted in FIG. 1 may be fabricated using processes consistent with a 22 nm technology node. The separation between intrinsic regions 24 and 16 is about 22 nm. If unintended diffusion of dopants from intrinsic region 24 into the intrinsic base region 32, and the unintended diffusion of dopants from intrinsic region 16 into the intrinsic base region 32 result in only 1 nm movement of the interface between intrinsic region 24 and intrinsic base region 32, and result in 1 nm movement of the interface between intrinsic region 16 and intrinsic base region 32, this causes the separation between intrinsic regions 24 and 16 to be reduced by 2 nm. That is almost a 10 percent change in the separation between intrinsic regions 24 and 16, which can translate into more than 10% change in the transistor current.

FIGS. 2-7 show an illustrative process flow for forming BJT devices in accordance with the present principles. While the present principles are described in terms of BJT devices, the present principles may be employed for any transistor device or any semiconductor device where diffusion suppression is desired.

Referring to FIG. 2, a SOI substrate 40 is provided, which may include a base substrate 12, a buried dielectric layer 14 and a semiconductor 34. In one example, the semiconductor 34 includes p– Ge (or n– Ge), although other materials may be employed. Shallow trench isolation (STI) regions (not shown) may be used for device isolation. STI formation may include etching trenches and filing the trenches with dielectric material as is known in the art. A single crystalline or polycrystalline layer 42 is grown or deposited to form an extrinsic base. The layer 42 may include SiGe and may be p+ or n+ doped depending on the device type. The layer 42 may or may not include C. If layer 42 includes C, it is preferably introduced in-situ using a C deposition source during epitaxial growth.

Referring to FIG. 3, a hard mask 44 is formed and patterned. The hard mask 44 may be patterned using lithography or other patterning processes. The hard mask 44 is preferably configured for etching the layer 42 to form a base extrinsic region 26. As known in the art, a thin Si cap (not shown) may have been disposed on top of semiconductor layer 34 prior to forming the layer 42 to serve as an etch stop for patterning the layer 42.

Referring to FIG. 4, spacers 28 (e.g., nitride) are formed over the sides of the mask 44 and the extrinsic base region 26 using known techniques.

Figure 5:
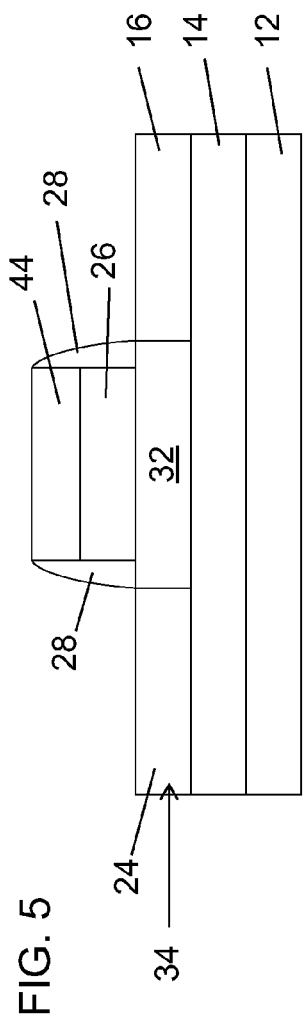
FIG. 5 is a cross-sectional view of the substrate of FIG. 4 having the semiconductor layer doped adjacent to the spacers to formed intrinsic regions for a collector and emitter of the bipolar junction transistor in accordance with the present principles.

Referring to FIG. 5, intrinsic emitter region 16 and intrinsic collector region 24 are doped ($n^+$ or $p^+$ depending on the device), e.g., by implantation using the hard mask 44 and spacers 28 as a mask. An additional carbon implant (or carbon co-implant) may be employed to add carbon to selected intrinsic regions 16, 24, as needed. In one embodiment, the intrinsic layers 16 and 24 include $n^+$ GeC, $n^+$ Ge, $p^+$ GeC, $p^+$ Ge, etc. Intrinsic base region 32 is defined by the formation of the intrinsic regions 16, 24.

Figure 6:
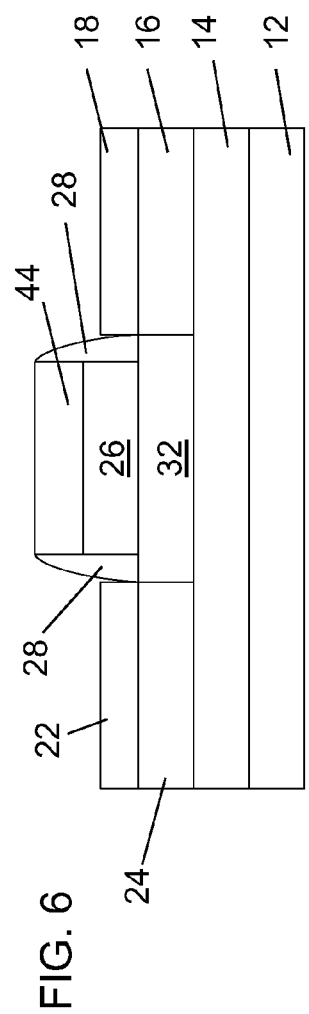
FIG. 6 is a cross-sectional view of the substrate of FIG. 5 having extrinsic regions formed for a collector and emitter of the bipolar junction transistor in accordance with the present principles.

Referring to FIG. 6, an extrinsic emitter region 18 and an extrinsic collector region 22 are formed, e.g., by selective epitaxial growth. In this way, growth occurs on the intrinsic regions 16 and 24 only, and not on the mask 44 or spacers 28.

In one embodiment, the extrinsic contact regions 18 and 22 may include n+ SiGe, p+ SiGe, etc. depending on the device. If carbon is incorporated, it is preferably incorporated in-situ during epitaxial growth. However, carbon may be incorporated by implantation after material growth for extrinsic contact regions 18 and 22. Carbon implantation may also be employed at this stage to implant carbon in the underlying intrinsic layers 16 and 24. The extrinsic contact regions 18 and 22 may include n+ SiGe, p+ SiGe, n+ SiGeC, p+ SiGeC, etc.

Figure 7:
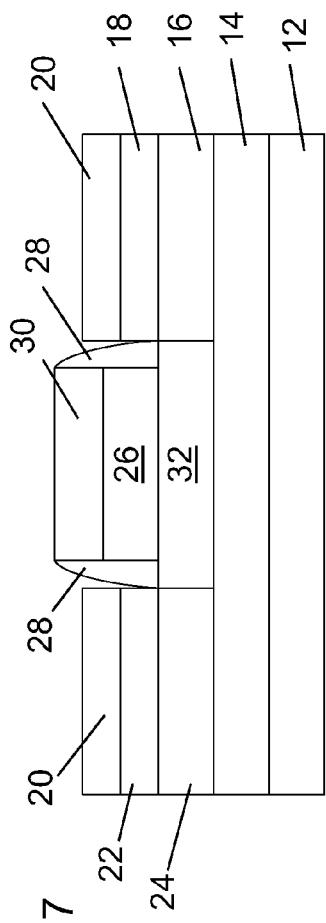
FIG. 7 is a cross-sectional view of the substrate of FIG. 6 having metal contacts formed on the extrinsic regions for the base, collector and emitter of the bipolar junction transistor in accordance with the present principles.

Referring to FIG. 7, the hard mask 44 is removed. A metal deposition process is performed to form contacts 20 and 30 to finish the device. The contacts 20, 30 may include any suitable metal or conductive compound, e.g., W, Ti, Cu, Au, Ag, TaN, TiN, etc.

Figure 8:
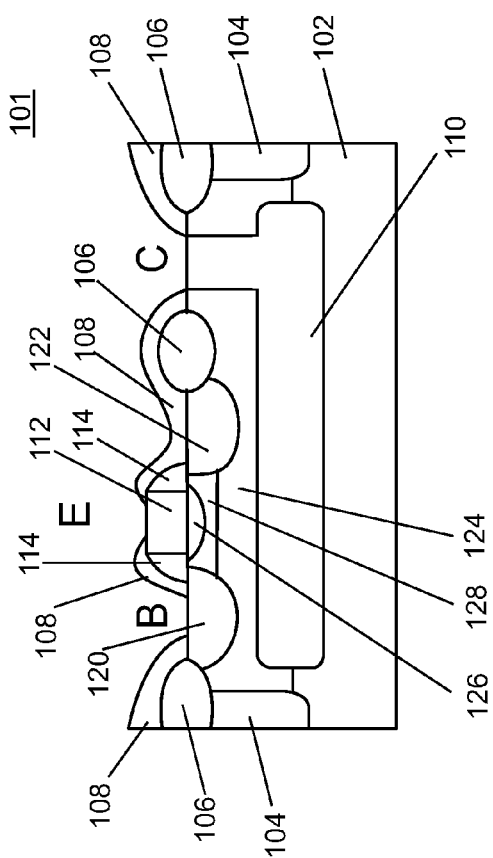
FIG. 8 is a cross-sectional view of a vertical bipolar junction transistor having carbon introduced for diffusion suppression in accordance with the present principles.
Figure 9:
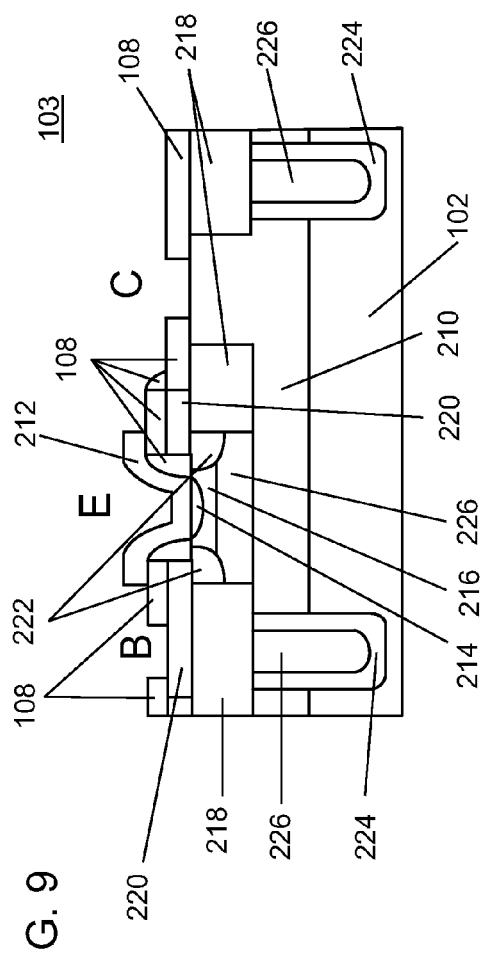
FIG. 9 is a cross-sectional view of another vertical bipolar junction transistor having carbon introduced for diffusion suppression in accordance with the present principles.

Referring to FIGS. 8 and 9, vertical devices 101 and 103, respectively, are illustratively shown. Although embodiments thus far have been directed towards lateral devices, the present principles are directed towards vertical devices as well.

Referring to FIG. 8, a BJT device 101 includes vertically disposed components. Collector C includes an extrinsic contact 110 in the form of a buried layer formed on and in a substrate 102 and below a portion of epitaxially formed layer 124. For an n-p-n BJT, the substrate 102 may include p– Ge or Si. The epitaxial layer 124 may include an n-type dopant and form an intrinsic region (124) of the collector C. An extrinsic base region 128 includes p– dopants, and extrinsic base regions 120 and 122 contain p+ dopants.

Emitter E includes an extrinsic contact region 112 which may include n+ doped polysilicon. An intrinsic region 126 is formed in the epitaxial layer 124. Base B includes extrinsic base region 120, 122, which may include p+ doped regions. Isolation structures in this embodiment may include oxide regions 106 (e.g., LOCOS), spacers 114, doped regions (p+) 104 and passivation regions 108.

In some embodiments, all layers are comprised of Ge (no Si) using known process flows (except polysilicon which typically includes Si). Polysilicon may be employed in region 112. In some embodiments, the substrate 102 includes Si, and the buried layer 110 includes graded SiGe, e.g., $Si_xGe_{1-x}$ where x varies from 1 to 0, and layers above the buried layer 110 are comprised of Ge.

At least one of the extrinsic base 120, 122, extrinsic emitter and collector regions 112, 110, respectively, includes carbon content preferably less than about 5% at., with less than about 1% being preferred. In other embodiments, the intrinsic base 128 and/or collector region 124 may have carbon content preferably less than about 1% at., with less than about 0.5% at. being preferred. FIG. 8 is described in terms of an n-p-n device but the present principles are applicable to p-n-p devices.

Referring to FIG. 9, a BJT device 103 includes vertically disposed components. Collector C includes an extrinsic contact 210 in the form of a buried layer formed on and in a substrate 102 and below a portion of epitaxially formed layer 226. The substrate 102 may include p– Ge or Si. For an n-p-n BJT, the epitaxial layer 226 may include an n-type dopant and form an intrinsic region (226) of the collector C. An intrinsic base region 216 and extrinsic base region 222 includes p-type dopants.

Emitter E includes an extrinsic contact region 212, which may include n+ doped polysilicon. An intrinsic region 214 is formed in the epitaxial layer 226. Base B includes an extrinsic base region 222, which may include p+ doped regions. P+ doped polysilicon contacts 220 contact the extrinsic base region 222, which is connected to the intrinsic base region 216. Isolation structures in this embodiment may include STI regions 218, deep trench dielectric regions 224, polysilicon regions 226 and passivation regions 108.

In some embodiments, all layers are comprised of Ge (no Si) using known process flows (except polysilicon which typically includes Si). Polysilicon may be employed in regions 212, 220 and 226. In some embodiments, the substrate 102 includes Si, the buried layer 210 includes graded SiGe, e.g., $Si_xGe_{1-x}$ where x varies from 1 to 0, and layers above the buried layer 210 are comprised of Ge.

At least one of the extrinsic base region 222, extrinsic emitter and collector regions 212, 210, respectively, includes carbon content preferably less than about 5% at., with less than about 1% being preferred. In other embodiments, the intrinsic base 216 and/or collector region 226 may have C content preferably less than about 1% at., with less than about 0.5% at. being preferred. FIG. 9 is described in terms of an n-p-n device but the present principles are applicable to p-n-p devices.

Figure 10:
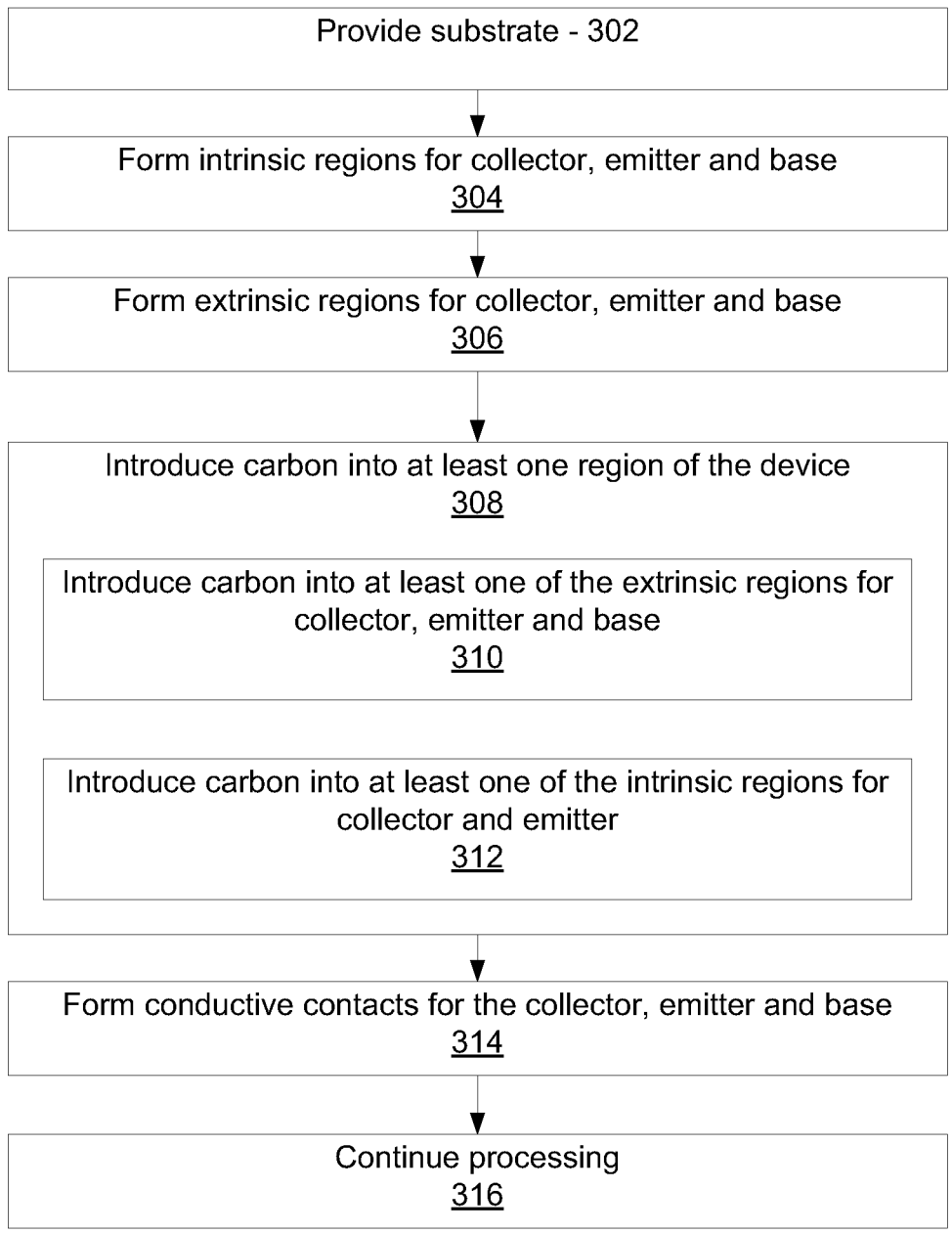
FIG. 10 is a block/flow diagram showing illustrative fabrication methods for a bipolar junction transistor having carbon introduced for diffusion suppression in accordance with the present principles.

Referring to FIG. 10, a method for forming a bipolar junction transistor with diffusion suppression is illustratively described. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 302, a substrate is provided on which a bipolar junction transistor is to be formed. The substrate may include a SOI, GOI, a bulk substrate, etc. having a dielectric layer or buried dielectric layer thereon. In block 304, a collector intrinsic region, an emitter intrinsic region and an intrinsic base region formed between the collector intrinsic region and the emitter intrinsic region are formed on or in a semiconductor layer. The collector intrinsic region, the emitter intrinsic region and the intrinsic base region may be formed from a semiconductor portion of a semiconductor-on-insulator structure.

In block 306, a collector extrinsic region is formed on the collector intrinsic region, an emitter extrinsic region is formed on the emitter intrinsic region and a base extrinsic region is formed on the intrinsic base region. This step may be performed by epitaxially growing or depositing the collector extrinsic region, the emitter extrinsic region and the base extrinsic region. Note that intrinsic/extrinsic collectors and intrinsic/extrinsic emitters have a same doping type. The extrinsic base and the intrinsic base region have a same dopant type but opposite the dopant type of the collector and emitter. Hence, n-p-n or p-n-p devices are formed.

The semiconductor portion may include Ge. The collector extrinsic contact region, the emitter extrinsic contact region and the base extrinsic contact region may include SiGe and are epitaxially grown (at the same or different times using the same or different processes) on the Ge of the semiconductor portion.

In block 308, carbon is introduced into one or more regions of the device. Carbon may be introduced by implantation, in-situ doping from a carbon source, diffusion, etc.

In block 310, carbon is introduced into at least one of the collector extrinsic contact region, the emitter extrinsic contact region and the base extrinsic contact region to suppress diffusion of dopants into the intrinsic base region. Less than about 5 atomic percent of carbon and preferably less than about 1 atomic percent of carbon is introduced into these regions.

In block 312, carbon may be introduced into at least one of the collector intrinsic region and the emitter intrinsic region. Less than about 1 atomic percent of carbon, and preferably less than about 0.5 atomic percent of carbon is introduced into these regions. It should be understood that carbon may be introduced into the at least one of the collector intrinsic region and the emitter intrinsic region without introducing carbon into at least one of the collector extrinsic contact region, the emitter extrinsic contact region and the base extrinsic contact region. However, introducing carbon into at least one of the collector extrinsic contact region, the emitter extrinsic contact region and the base extrinsic contact region is preferred.

In one embodiment, carbon implanted into at least one of the collector extrinsic contact region, the emitter extrinsic contact region, the base extrinsic contact region, the intrinsic collector region and the intrinsic emitter region.

In block 314, conductive contacts may be formed on the extrinsic contacts or regions of the collector, emitter and base. The conductive contact material may be selectively deposited or formed by other methods. In block 316, processing can continue, as needed.

Having described preferred embodiments for bipolar transistor with carbon alloyed contacts (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a bipolar junction transistor, comprising:
   forming a collector intrinsic region, an emitter intrinsic region and an intrinsic base region between the collector intrinsic region and the emitter intrinsic region;
   forming a collector extrinsic contact region in contact with the collector intrinsic region, an emitter extrinsic contact region in contact with the emitter intrinsic region and a base extrinsic contact region in contact with the intrinsic base region; and
   introducing carbon into at least one of the collector extrinsic contact region and the emitter extrinsic contact region to suppress diffusion of dopants into one or more junction regions in the bipolar junction transistor.

2. The method as recited in claim 1, wherein introducing includes introducing less than about 5 atomic percent of carbon.

3. The method as recited in claim 1, wherein introducing includes introducing less than about 1 atomic percent of carbon.

4. The method as recited in claim 1, further comprising further introducing carbon into at least one of the collector intrinsic region and the emitter intrinsic region.

5. The method as recited in claim 4, wherein further introducing includes introducing less than about 1 atomic percent of carbon.

6. The method as recited in claim 4, wherein further introducing includes introducing less than about 0.5 atomic percent of carbon.

7. The method as recited in claim 1, wherein the collector intrinsic region, the emitter intrinsic region and the intrinsic base region are formed from a semiconductor portion of a semiconductor-on-insulator structure.

8. The method as recited in claim 7, wherein the semiconductor portion includes Ge and the collector extrinsic contact region, the emitter extrinsic contact region and the base extrinsic contact region include SiGe and are epitaxially grown on the Ge of the semiconductor portion.

9. The method as recited in claim 1, wherein introducing includes implanting carbon into at least one of the collector extrinsic contact region, the emitter extrinsic contact region and the base extrinsic contact region.

10. A method for forming a bipolar junction transistor, comprising:
    growing an epitaxial layer on a semiconductor layer;
    forming a mask on the epitaxial layer and etching the epitaxial layer to form an extrinsic base region therein and to define an intrinsic base region in the semiconductor layer;
    forming spacers on lateral sides of the extrinsic base region;
    doping the semiconductor layer on opposite sides of the extrinsic base region to form an intrinsic collector region and an intrinsic emitter region;
    growing an extrinsic collector region and an extrinsic emitter region from the intrinsic collector region and the intrinsic emitter region, respectively;
    introducing carbon into at least one of the extrinsic collector region, the extrinsic emitter region and the extrinsic base region to suppress diffusion of dopants into the intrinsic base region; and
    forming conductive contacts on the extrinsic base region, the extrinsic collector region and the extrinsic emitter region.

11. The method as recited in claim 10, wherein introducing includes introducing less than about 5 atomic percent of carbon.

12. The method as recited in claim 10, further comprising further introducing carbon into at least one of the intrinsic collector region and the intrinsic emitter region, wherein further introducing includes introducing less than about 1 atomic percent of carbon.

13. The method as recited in claim 10, wherein the intrinsic collector region, the intrinsic emitter region and the intrinsic base region are formed from the semiconductor layer, which includes a semiconductor portion of a semiconductor-on-insulator structure.

14. The method as recited in claim 10, wherein introducing includes introducing carbon into at least one of the extrinsic collector region, the extrinsic emitter region, the extrinsic base region, the intrinsic collector region and the intrinsic emitter region.

* * * * *